(12) United States Patent
Seliger et al.

(10) Patent No.: US 7,208,347 B2
(45) Date of Patent: Apr. 24, 2007

(54) CONNECTION TECHNOLOGY FOR POWER SEMICONDUCTORS COMPRISING A LAYER OF ELECTRICALLY INSULATING MATERIAL THAT FOLLOWS THE SURFACE CONTOURS

(75) Inventors: Norbert Seliger, München (DE); Karl Weidner, München (DE); Jörg Zapf, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/547,173

(22) PCT Filed: Jan. 26, 2004

(86) PCT No.: PCT/EP2004/000629

§ 371 (c)(1),
(2), (4) Date: Aug. 26, 2005

(87) PCT Pub. No.: WO2004/077548

PCT Pub. Date: Sep. 10, 2004

(65) Prior Publication Data

US 2006/0192290 A1    Aug. 31, 2006

(30) Foreign Application Priority Data

Feb. 28, 2003  (DE) .................. 103 08 978

(51) Int. Cl.
*H01L 21/44* (2006.01)
*H01L 21/48* (2006.01)
*H01L 21/50* (2006.01)

(52) U.S. Cl. .............. 438/124; 438/126; 438/612; 257/E23.02; 257/E23.021; 257/E23.023

(58) Field of Classification Search .......... 438/124, 438/126, 612; 257/E23.02, E23.021, E23.023
See application file for complete search history.

(56) References Cited

U.S. PATENT DOCUMENTS

| 5,291,066 | A | | 3/1994 | Neugebauer et al. |
| 5,616,886 | A | | 4/1997 | Romero et al. |
| 5,637,922 | A | | 6/1997 | Fillion et al. |
| 5,760,418 | A | * | 6/1998 | Lee et al. ............... 257/20 |
| 6,002,163 | A | * | 12/1999 | Wojnarowski ........... 257/620 |
| 2003/0006493 | A1 | | 1/2003 | Shimoishizaka et al. |
| 2004/0099940 | A1 | * | 5/2004 | Standing ................. 257/693 |
| 2005/0032347 | A1 | | 2/2005 | Hase et al. |

FOREIGN PATENT DOCUMENTS

| DE | 91 09 295 U1 | 11/1991 |
| DE | 42 28 274 A1 | 3/1994 |
| DE | 199 54 941 A1 | 6/2001 |
| EP | 0 987 760 A2 | 3/2000 |
| WO | WO 01/37338 A2 | 5/2001 |
| WO | WO 03/030247 A2 | 4/2003 |

OTHER PUBLICATIONS

Paavo Jalonen; "A new concept® for making fine line substrate for active component in polymer"; Microelectronics Journal; Feb. 2003; pp. 99-107; vol. 34, No. 2; Mackintosh Publications Ltd.; Luton, Germany.

A. Ostmann, A. Neumann, J. Auersperg, C. Ghahremani, G. Sommer, R. Aschenbrenner and H. Reichl; "Integration of Passive and Active Components into Build-Up Layers"; Electronics Packaging Technology Conference 4TH; IEEE 2002; pp. 223-228.

(Continued)

*Primary Examiner*—William M. Brewster

(57) ABSTRACT

A layer of electrically insulating material is applied to a substrate and a component located thereon, in such a way that said layer follows the surface contours.

16 Claims, 1 Drawing Sheet

OTHER PUBLICATIONS

A. Ostmann, A Neumann; "Chip in Polymer—the Next Step in Miniaturization"; Advancing Microelectronics; May/Jun. 2002; pp. 13-15; vol. 29, No. 3.

Burhan Ozmat, Charlie S. Korman, Ray Fillion; "An Advanced Approach to Power Module Packaging"; pp. 8-11; IEEE 2000; 0-7803-6437-6.

R. Fisher, R. Fillion, J. Burgess, and W. Hennessy; "High Frequency, Low Cost, Power Packaging Using Thin Film Power Overlay Technology"; Applied Power Electronics Conference and Exposition, Conference Proceedings Mar. 5-9, 1995; Tenth Annual, Dallas TX, USA; IEEE 1995; pp. 12-17.

* cited by examiner

CONNECTION TECHNOLOGY FOR POWER SEMICONDUCTORS COMPRISING A LAYER OF ELECTRICALLY INSULATING MATERIAL THAT FOLLOWS THE SURFACE CONTOURS

CROSS REFERENCE TO RELATED APPLICATIONS

This application is the US National Stage of International Application No. PCT/EP2004/000629, filed Jan. 26, 2004 and claims the benefit thereof. The International Application claims the benefits of German application No. 10308978.0, filed Feb. 28, 2003. The International Application and the German application are incorporated by reference herein in their entirety:

FIELD OF INVENTION

The invention relates connection technology for power semiconductors comprising a layer of electrically insulating material that follows the surface contours.

BACKGROUND OF THE INVENTION

The most widely established technology for interconnecting power semiconductor chips and connecting them to conductor tracks is thick-wire bonding. Ultrasound energy is used to create a permanent connection between the Al wire, which has a typical diameter of several hundreds of µm, and the contact surface, which is of Al on the chip and Cu on the power module, via an intermetallic connection.

There are alternative techniques to bonding such as Thin-Pak. In this technique, contact is made with the chip surface via solder applied over holes in a ceramic plate.

In MPIPPS (Metal Posts Interconnected Parallel Plate Structures) the contacts are made by soldered copper posts.

Another way of making contact is via solder bumps for flip-chip technology. This method additionally enables improved heat dissipation because the power semiconductors can be soldered onto DCB substrates on the upper and lower face (DCB stands for Direct Copper Bonding).

Contact is also made over a wide area via vapor-deposited Cu leads, the insulation of the conductor tracks being achieved by vapor-phase deposition of an insulator (CVD process) (Power Module Overlay Structure).

Finally, making contact using a patterned foil via an adhesive or solder process is also known.

U.S. Pat. No. 5,616,886 proposes the bondless module without specifying any process details.

Ozmat B., Korman C. S. and Filion R.: "An Advanced Approach to Power Module Packaging", 0-7803-6437-6/00, IEEE 2000 discloses a method in which power semiconductors are positioned on a tensioned film within a frame.

A method is known from Ostmann A., Neumann A.: "Chip in Polymer—the Next Step in Miniaturization", in "Advanced Microelectronics", Volume 29, No. 3, May/June 2002, in which logic chips located on a substrate are embedded in a polymer.

SUMMARY OF THE INVENTION

The object of the invention is to provide a method for making contact with one or more electrical contact surfaces on a substrate mounted component suitable for power electronics and for which even with highly constructive power components it is possible to make contact with a conductor track located on the substrate.

This object is achieved by the invention specified in the claims.

Accordingly, in a method for manufacturing a device with a component arranged on a substrate, the substrate and component forming a surface contour and the component featuring an electrical contact surface, a layer of electrically insulating material is applied to the substrate and the component in such a way that the layer of electrically insulating material follows the surface contours formed by the substrate and component i.e. the layer of electrically insulating material runs on the surface contours conforming to the surface contours formed by the substrate and component. If on the other hand, in accordance with the prior art, logic chips are embedded in a polymer, then it is only the lower face of the polymer layer which follows the surface contours rather than the polymer layer itself.

The fact that the layer of electrically insulating material follows the surface contours formed by the substrate and component means, in particular if a power component is used as a component, immediately yields two advantages. On the one hand it ensures that the layer of electrically insulating material covering the edges of the component facing away from the substrate is sufficiently thick to prevent a breakdown at high voltages or field strengths. On the other, the layer of electrically insulating material next to the typically very tall performance component on the substrate is not so thick that there would be a problem exposing and establishing a connection with contact surfaces on the substrate's conductor tracks.

The electrical contact surface of the component remains exposed when applying the layer of electrically insulating material and/or is exposed after the layer of electrically insulating material has been applied, in particular by the opening of a window.

A layer of electrically conducting material is then applied to the layer of electrically insulating material and the electrical contact surface of the component. The layer of electrically insulating material is therefore a carrier layer for the layer of electrically conducting material.

It goes without saying that it lies within the scope of the invention to proceed in this manner where there is a substrate on which a number of components with contact surfaces are arranged and/or where there are components with a number of contact surfaces.

In particular, the layer of electrically insulating material is not a film.

The thickness of the layer of electrically insulating material covering the straight-edged area of the substrate differs by less than 50% from the thickness of the layer covering the straight-edged area of the components, particularly by less than 20%. The thicknesses are preferably approximately the same, that is to say will differ one from the other by less than 5%, or even less than 1%. The percentage figures refer in particular to the thickness of the layer covering the straight-edged area of the component, which thus yields the 100%. The straight-edge area is considered as the layer in the inner edges of the substrate and component being typically thicker while being typically thinner where it covers the edges of the component facing away from the substrate.

For connecting the component with the substrate, the substrate preferably comprises an electrical contact surface which remains exposed during the application of the layer of electrically conducting material or which is exposed after the application of the layer of electrically insulating material which is applied to the layer of electrically conducting material in the same way. The contact surface of the component is thus connected with the contact surface of the substrate via the layer of electrically conducting material.

The contact surface of the component and the contact surface of the substrate are preferably of approximately equal size in order to ensure a constant electrical flow.

The electrical contact surface of the component may be left exposed during the application of the layer of electrically insulating material and/or may be exposed later. The complete or partial exposure of the surface during the application itself may be achieved particularly advantageously if the layer of electrically insulating material is applied with openings. That means that from the outset a layer of electrically insulating material can be used with one or a number of corresponding openings or windows which for example were previously created by means of low cost stamping or blanking.

If in exposing the contact surface a window is opened up which is more than 60% of the size of the side and/or surface of the component on which the window is being opened up, in particular more than 80%, then use may be made of the method for performance components, the contact surface of which is of a corresponding size. On the other hand, in order to ensure quality processing of the edges, the size of the window should not exceed 99.9% of the size of the side and/or surface of the component on which the window is being opened and in particular not exceed 99%, and preferably not exceed 95%. In particular the window is opened on the largest side and/or side of the component that is facing away from the substrate and is preferably of an absolute size exceeding 50 mm$^2$, in particular exceeding 70 mm$^2$.

Any organic or inorganic based circuit supports may be used as a substrate. Such substrates are for example PCB (Printed Circuit Board), DCB, IM (Insulated Metal), HTCC (High Temperature Cofired Ceramics) and LTCC (Low Temperature Cofired Ceramics) substrates.

The layer of electrically insulating material is in particular made of a plastic. Depending on how it is processed, it may or may not be photosensitive.

It is preferably applied using one or more of the following techniques: curtain casting, immersion, in particular unilateral immersion, spraying, in particular electrostatic spraying, printing, in particular screen printing, overmolding, dispensing, spincoating.

To apply the layer of electrically conducting material, namely to make planar contact, it is advantageous to execute physical or chemical deposition of the electrically conducting material. Physical techniques such as these include spluttering and physical vapor deposition, PVD. Chemical deposition can be performed from the vapor phase (Chemical Vapor Deposition, CVD) and/or liquid phase (Liquid Phase Chemical Vapor Deposition).

It is also possible that a thin electrically conducting partial layer, of titanium/copper for example, is applied at first by one of these techniques, and then a thicker electrically conducting partial layer, of copper for example, is applied to this by electro-deposition.

Preferably, in the method according to the invention a substrate is used having a surface equipped with one or more semiconductor chips, in particular power semiconductor chips, on each of which are one or more contact surfaces to which contact is to be made, wherein the layer of electrically insulating material is applied to this surface under vacuum, so that the layer of electrically insulating material covers this surface including every semiconductor chip and every contact surface with a tight fit, and adheres to this surface including every semiconductor chip.

The layer of electrically insulating material is designed here so that it can surmount a height difference of up to 1000 µm. Reasons for the height difference include the substrate topology and the semiconductor chips arranged on the substrate.

The thickness of the layer of electrically insulating material may be between 10 µm and 500 µm. In the method according to the invention the layer of electrically insulating material is preferably applied with a thickness of 25 to 150 µm.

In a further embodiment, the application is repeated as many times as is necessary to achieve a particular thickness of the layer of electrically insulating material. For example, lesser thickness partial layers of electrically insulating material are made into a larger thickness layer of electrically insulating material. These partial layers of electrically insulating material are advantageously made of a type of plastic. These layers of electrically insulating material are advantageously made of a type of plastic. It is also possible for the partial layers to be made of a plurality of different plastics. A layer of electrically insulating material made up of partial layers is obtained.

In a particular embodiment, a window is opened in the layer of electrically insulating material by laser ablation in order to expose the electrical contact surface of the component. A wavelength of a laser employed for this purpose is between 0.1 µm and 11 µm. The power of the laser equals between 1 W and 100 W. It is preferable to use a CO2 laser with a wavelength of 9.24 µm. In this process, the windows are opened without damaging any chip contacts of aluminum, gold or copper that may lie under the layer of insulating material.

In a further embodiment, a photosensitive layer of electrically insulating material is used and a window is opened by a photo-lithographical process to expose the electrical contact surface of the component. The photo-lithographical process involves exposing the photo sensitive layer of electrically insulated material and developing and thus removing the exposed or unexposed areas of the layer of electrically insulating material.

After opening the window, cleaning may be performed in which residues of the layer of electrically insulating material are removed. The cleaning is performed by a wet-chemical process for example. In particular, a plasma cleaning technique is also possible.

In a further embodiment, a layer is used having a plurality of partial layers made of different electrically conducting material arranged one above the other. For instance different metal layers are applied on top of each other.

The number of partial layers or metal layers equals in particular 2 to 5. A partial layer acting as a diffusion barrier can be integrated for example by the electrically conducting layer composed of a plurality of partial layers. Such a partial layer is made of a titanium-tungsten alloy for example (TiW). Advantageously, in a multi-layer structure, a partial layer providing or improving adhesion is applied directly to the surface to which contact is to be made. Such a partial layer is made of titanium for example.

In a particular embodiment, after the planar contact is made, at least one conductor track is formed in and/or on the layer made of electrically conducting material. The conductor track can be applied to the layer. In particular, the layer is patterned to produce the conductor track. This means that the conductor track is formed in this layer. The conductor track is used, for example, to make electrical contact with a semiconductor chip.

Patterning is usually performed in a photolithographic process in which a photoresist can be applied to the electrically conducting layer, dried and then exposed and developed. Sometimes this is followed by tempering to stabilize the applied photoresist for subsequent treatment processes. Traditional positive and negative resists (coating materials) can be used as photoresists. The photoresist is applied by a spraying or immersion process for example. Electro-deposition (electrostatic or electrophoretic deposition) is also possible.

Instead of a photoresist, another patternable material may also be applied using one or more of the following techniques: curtain casting, immersion, in particular immersion of one side, spraying, in particular electrostatic spraying, printing, in particular silkscreen printing, overmolding, dispensing, spincoating, laminating of a film.

Photosensitive films can also be used for patterning, which are laminated on, and exposed and developed in a similar way to the applied photoresist coating.

The conductor track can be produced as follows for example: in a first sub-step the electrically conducting layer is patterned and in a subsequent sub-step a further metallization is applied to the conductor track produced. The conductor track is reinforced by the additional metallization. For example, copper is applied by electro-deposition to the conductor track produced by patterning in a thickness of 1 µm and 400 µm. Then the photoresist layer or respectively the laminated film is removed. This is done using an organic solvent, an alkaline developer or the like for example. The planar, metallically conducting layer not reinforced with the metallization is removed again by subsequent differential etching. The reinforced conductor track is retained.

In a particular embodiment, the lamination, uncovering, contact making, and creation of conductor tracks are performed a number of times to fabricate a multi-layer device.

The invention advantageously provides a novel technology for making electrical contact and wiring up contact pads or contact surfaces arranged on semiconductor chips, in particular on power semiconductor chips. In addition, in the method according to the invention, the planar interface and the particular insulation result in a low-inductance connection to enable rapid and low-loss switching.

Applying the layer of electrically insulating material creates an electrically insulating layer. Creating the insulating layer by applying the layer of electrically insulating material according to the invention offers the following advantages:

High-temperature use. If the appropriate material is selected, a layer of electrically insulating material is heat resistant up to 300° C.

Low process costs

High dielectric field strengths are possible by using thick insulation layers.

High production rate, e.g. DCB substrates can be processed advantageously.

Homogeneous insulation properties, because air pockets are prevented by processing the layer of electrically insulated material in the vacuum.

The whole chip contact surface can be used, allowing high currents to be diverted away.

The chips can be driven homogeneously because of the planar contacting.

The contact inductance for a contact surface is less than for thick-wire bonding owing to the planar geometry.

The contacting results in high reliability under vibration and mechanical shock stress.

Greater stress cycle endurance compared with competing methods because of lower thermo-mechanical stresses.

A plurality of wiring planes are accessible.

The described planar connection technology occupies a low overall height, resulting in a compact structure.

With multi-layer connecting planes, large-area metallization layers for screening can be realized. This is highly beneficial particularly for the EMC (electromagnetic compatibility) performance of the circuit (noise emission, noise immunity).

Preferred and advantageous embodiments of the device result from the preferred embodiment of the method.

Further features and advantages will emerge from the description of an exemplary embodiment based on the drawing.

DETAILED DESCRIPTION OF THE INVENTION

Figure 1:
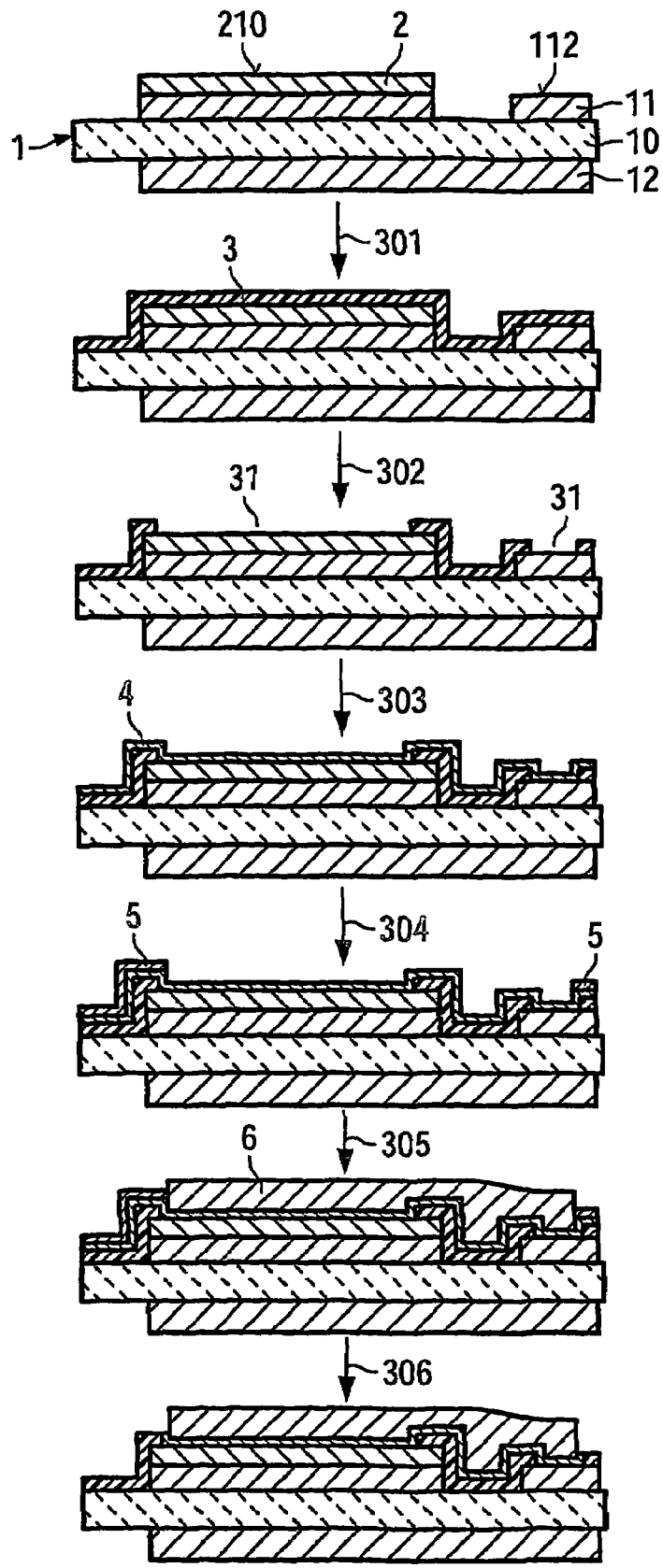
FIG. 1 shows a method for making contact with a performance semiconductor.

In FIG. 1, the substrate of the example is given the general label 1. This substrate 1 has a DCB substrate, for example, consisting of a substrate layer 10 of ceramic material, a copper layer 12 applied to a lower surface of the substrate layer 10, and a copper layer 11 applied to a surface of the substrate layer 10 facing away from the lower surface.

Areas of the layer 11 on the upper surface of the substrate layer 10 are removed down to the upper surface of the substrate 10, so that the upper surface is exposed there. The copper layers 11 and 12 form conductor tracks on the substrate.

One of more semiconductor chips 2, which may be identical to and/or different from each other, are applied to the surface of the remaining copper layer 11 facing away from the substrate layer 10.

The semiconductor chip 2, which is preferably a power semiconductor chip, makes planar contact with the upper surface of the layer 11 by a contact surface not shown, which exists on a lower surface of the chip 2 facing the copper layer 11. For example, this contact surface is soldered to the layer 11.

On the upper surface of each chip 2 facing away from the copper layer 11 and the lower surface, there is in each case a contact having a contact surface 210 facing away from the semiconductor chip 2.

If the semiconductor chip 2 is a transistor for example, the contact surface on the lower surface of this semiconductor chip 2 is the contact surface of a collector and/or drain contact, and the contact on the upper surface of the semiconductor chip 2 is an emitter or source contact, whose contact surface is the contact surface 210.

The complete upper surface of the substrate 1 equipped with the semiconductor chip 2 is given by the exposed parts of the upper surface of the layer 10, the upper surface of the copper layer 11 outside the semiconductor chip 2 and by the exposed surface of each semiconductor chip 2 itself defined by the upper surface and the lateral surface of this semiconductor chip 2.

In step 301 a layer 3 of electrically insulating plastic is applied under vacuum to the entire upper surface of the substrate 1 equipped with the semiconductor chip 2 such that the layer 3 of electrically insulating material covers with a tight fit and adheres to the surface of the substrate 1 populated with the semiconductor chip 2. In so doing, the layer 3 of electrically insulating material follows the surface contours formed by the uncovered parts of the upper surface of the substrate layer 10, the upper surface of the copper layer 11 outside the semiconductor chip 2 and by the exposed surface of each semiconductor chip 2 itself which is determined by the upper surface and lateral surface of this chip 2.

The layer 3 of electrically insulating material applied in step 301 will preferably employ one or more of the following techniques: curtain casting, immersion, in particular unilateral immersion, spraying, in particular electrostatic spraying, printing, in particular screen printing, overmolding, dispensing, spin coating.

The layer 3 of electrically insulating material serves as an insulator and as a carrier of a subsequently applied layer 4 of electrically conducting material.

Typical thicknesses of the layer 3 of electrically insulating material lie in the range 25–150 µm, where larger thicknesses can also be achieved from a series of thinner partial layers of electrically insulated material. This advantageously enables dielectric field strengths in the region of a few tens of kV to be achieved.

Now in step 302, each contact surface to which contact is to be made on the surface of the substrate 1, including the component 2, is exposed by opening respective windows 31 in the layer 3 of electrically insulating material.

A contact surface to which contact is to be made is not just a contact surface 210 on a semiconductor chip 2, but may also be any area of the upper surface of the layer 11 made of copper or another metal that is exposed by making a window 31 in the layer 3 of electrically insulating material.

The size of the window which is opened in order to make contact with the contact surface (210) is greater than 60% of the size of the component, in particular greater than 80%.

One of the windows 31 in the layer 3 of electrically insulating material is preferably opened by laser ablation.

Subsequently, in step 303, planar contact is made with every exposed contact surface 210 of the component and of the substrate 112 by a layer 4 made of electrically conducting material, preferably metal, by metallizing and patterning the exposed contact surfaces 210 and 112 using standard techniques and hence making planar contact.

For example, the layer 4 can be applied both to every contact surface 210 and 112 and to the upper surface of the layer 3 facing away from the surface of the substrate 1, and then, for example, patterned by photolithography in such a way that every contact surface 210 and 112 remains in planar contact and conductor tracks 4, 6 are formed above the contact surfaces 210 and 112 and the layer 3 of insulating material.

The following process steps are preferably performed (semi additive construction):
i) Sputtering of a Ti adhesive layer of approximately 100 nm in thickness and a Cu conducting layer 4 of approximately 200 nm in thickness (step 303).
ii) Photolithography using thick resist layers or photofilms 5 (step 304).
iii) Reinforcement of the exposed areas by electro-deposition of an electrically conducting layer 6. Layer thicknesses of up to 500 µm are possible here (step 304).
iv) Removal of resist layer and differential etching of Cu and Ti (step 306).

One can also proceed by applying a mask to the upper surface of the layer 3 of electrically insulating material facing away from the surface of the substrate 1, the mask leaving exposed the contact surfaces 210 and 112 as well as areas for the conductor tracks 4, 6 running across the contact surfaces 210 and 112 and the layer 3 of insulating material and then applying the layer 4 made of the electrically conducting material unselectively to the mask and the contact surfaces 210 and 112 and to the areas left exposed by the mask. Then the mask is removed together with the layer 4 on top of it, so that all that remains are the contact surfaces 210 and 112 making planar contact and the conductor tracks 4, 6 running across the contact surfaces 210 and 112 and the layer 3 of insulating material.

Either way results subsequently in a device having a substrate 1 with a component 2 having a surface on which electrical contact surfaces 210, 112 are arranged, in which an insulator in the form of a layer 3 made of electrically insulating material is applied making a tight fit with the surface and adhering to the surface, and in which the layer 3 of electrically insulating material has a window at each contact surface 210 and 112 in which this contact surface 210 and 112 is clear of the layer 3 and is in planar contact with a layer 4 and for example additionally with a layer 6 made of electrically conducting material. Special embodiments of this device follow from the above description.

What is claimed is:

1. A method of manufacturing a device having a contacting structure including a power electronics semiconductor chip mounted on a substrate with the chip having an electrical contact surfaces, the method comprising:
   providing a substrate of the circuit supporting type and attaching the power electronics semiconductor chip to a conductive layer formed on the substrate;
   attaching an insulating layer of electrically insulating material to the substrate and to the chip after the chip is attached to the substrate such that the insulating layer follows a surface contour formed by the substrate and the chip, wherein the electrical contact surface of the chip remains at least partially free of insulating material;
   applying a conducting layer of electrically conductive material onto the insulating layer and onto the contact surface, wherein attaching the insulating layer is performed such that a thickness of the insulating layer covering a straight-edged area of the substrate differs by less than 50% from a thickness of the insulating layer covering a straight-edged area of the chip.

2. The method according to claim 1, wherein the thickness of the insulating layer covering the straight-edged area of the substrate differs by less than 20% from the thickness of the insulating layer covering the straight-edged area of the chip.

3. The method according to claim 1, wherein the insulating layer does not comprise a foil.

4. The method according to claim 1, wherein attaching the insulating layer includes applying the electrically insulating material to the chip and removing the electrically insulating material such that the contact surface is set free.

5. The method according to claim 1, wherein attaching the insulating layer includes applying the electrically insulating material by an applying method chosen from the group consisting of curtain coating, dipping, discharge coating, printing, overmolding, dispensing, and spin coating.

6. The method according to claim 1, wherein the substrate is selected from the group consisting of a printed circuit board, a direct copper bond substrate, an insulated metal substrate, a high temperature cofired ceramic substrate and a low temperature cofired ceramic substrate.

7. The method according to claim 1, wherein the chip comprises a thickness of at least 70 µm relative to a direction orthogonal to a surface of the substrate.

8. The method according to claim 1, wherein the substrate comprises a conductor track having a thickness of at least 100 μm.

9. The method according to claim 1, wherein attaching the insulating layer results in a free contact surface comprising at least 60% of an extent of the component.

10. The method according to claim 9, wherein the free conduct contact surface comprises at least 80% of the extent of the component.

11. The method according to claim 4, wherein removing the electrically insulating material includes laser ablation.

12. The method according to claim 4, wherein the electrically insulating material is photosensitive, and removing the electrically insulating material includes a photo-lithographic process.

13. The method according to claim 1, wherein applying the conducting layer includes arranging at least two part conducting layers having different electrically conductive materials one above the other.

14. The method according to claim 13, wherein arranging at least one of the part conducting layers includes electroplating corresponding electrically conductive material.

15. The method according to claim 14, wherein an upper part conducting layer is arranged by electroplating.

16. The method according to claim 1, wherein the device is a multilayer device and for fabrication the multilayer device, attaching the insulating layer and applying the conducting layer are performed several times.

* * * * *